United States Patent
Lützen et al.

(10) Patent No.: US 6,977,405 B2
(45) Date of Patent: Dec. 20, 2005

(54) SEMICONDUCTOR MEMORY WITH MEMORY CELLS COMPRISING A VERTICAL SELECTION TRANSISTOR AND METHOD FOR FABRICATING IT

(75) Inventors: Jörn Lützen, Dresden (DE); Bernd Goebel, Dresden (DE); Dirk Schumann, Schönfliess (DE); Martin Gutsche, Dorfen (DE); Harald Seidl, Feldkirchen (DE); Martin Popp, Dresden (DE); Alfred Kersch, Putzbrunn (DE); Werner Steinhögl, München (DE)

(73) Assignee: Infineon Technologies, AG, (DE)

( * ) Notice: Subject to any disclaimer, the term of this patent is extended or adjusted under 35 U.S.C. 154(b) by 0 days.

(21) Appl. No.: 10/792,742

(22) Filed: Mar. 5, 2004

(65) Prior Publication Data

US 2004/0201055 A1   Oct. 14, 2004

Related U.S. Application Data

(63) Continuation of application No. PCT/DE02/02980, filed on Aug. 14, 2002.

(30) Foreign Application Priority Data

Sep. 5, 2001  (DE) ................................ 101 43 650

(51) Int. Cl.⁷ .......................................... H01L 27/108
(52) U.S. Cl. ..................... 257/301; 257/301; 257/302; 438/243; 438/244; 438/386; 438/387
(58) Field of Search .................. 257/E21.652, E27.096, 257/301, 302; 438/243, 244, 386, 387

(56) References Cited

U.S. PATENT DOCUMENTS 5,519,236 A   5/1996   Ozaki
5,776,836 A   7/1998   Sandhu

FOREIGN PATENT DOCUMENTS

JP                62140456            6/1987

(Continued)

OTHER PUBLICATIONS

Powell et al, "Thin Films", Academic Press, ISBN: 0-12-533026-X, 1999, S. pp. 195-213.

(Continued)

Primary Examiner—Mai-Huong Tran
(74) Attorney, Agent, or Firm—Edell, Shapiro & Finnan, LLC

(57) ABSTRACT

In order to fabricate a semiconductor memory, a trench capacitor is arranged in a first trench. Beside the first trench, a first longitudinal trench and, parallel on the other side of the first trench, a second longitudinal trench are arranged in the substrate. A first spacer word line is arranged in the first longitudinal trench and a second spacer word line is arranged in the second longitudinal trench. There are arranged in the first trench connecting webs between the first spacer word line and the second spacer word line which have a thickness which, in the direction of the first spacer word line, is less than half the width of the first trench in the direction of the first spacer word line.

10 Claims, 14 Drawing Sheets

U.S. PATENT DOCUMENTS

| | | | |
|---|---|---|---|
| 6,172,391 B1 | 1/2001 | Goebel et al. | |
| 6,436,836 B2 * | 8/2002 | Gobel | ........................ 438/700 |
| 6,586,795 B2 | 7/2003 | Goebel et al. | |
| 2003/0169629 A1 | 9/2003 | Goebel et al. | |

FOREIGN PATENT DOCUMENTS

| | | |
|---|---|---|
| JP | 01266756 | 10/1989 |
| JP | 02014563 | 1/1990 |

OTHER PUBLICATIONS

Powell et al, "Thin Films", Academic Press, ISBN: 0-12-533026-X, 1999., S. pp. 191-195.

Powell et al, "Thin Films", Academic Press, ISBN: 0-12-533026-X, 1999., S. pp. 241-249.

Butler, et al., "Long throw and ionized PVD", Solid state technology, ISSN 0038-111X, S. pp. 183-190.

* cited by examiner

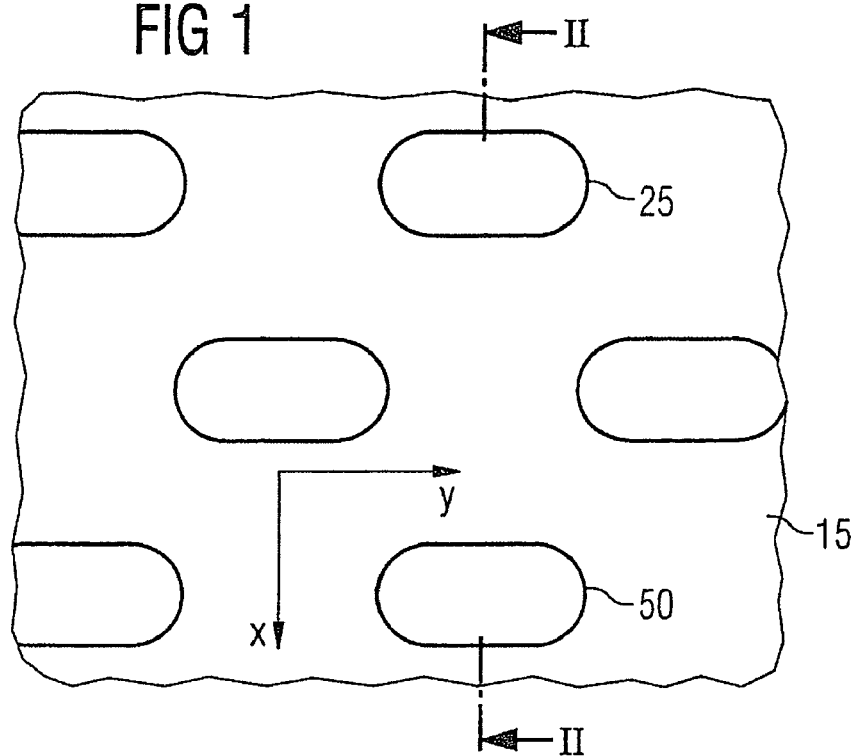
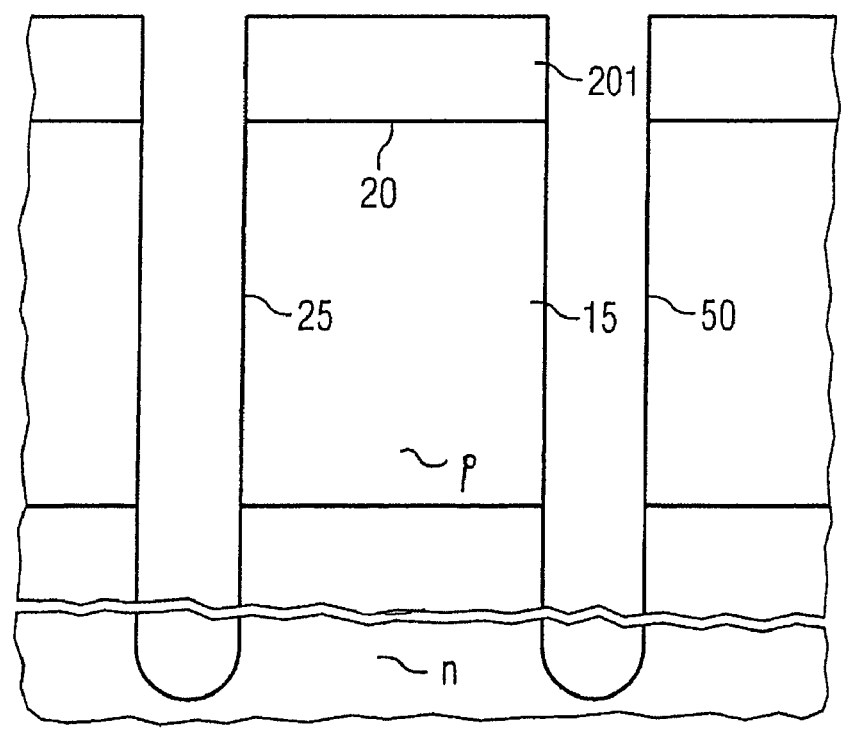

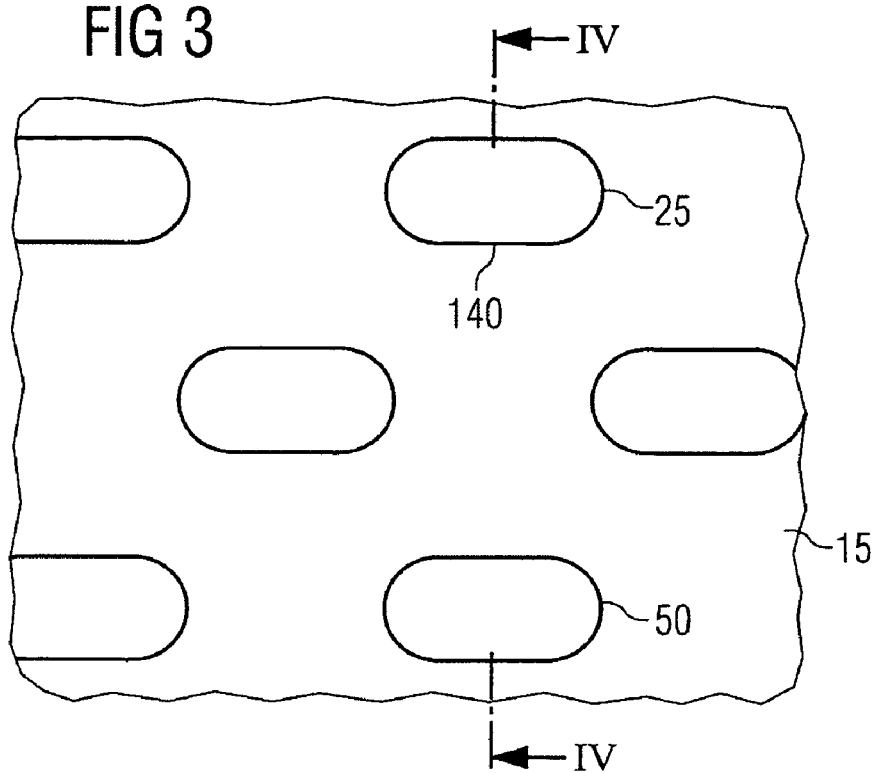
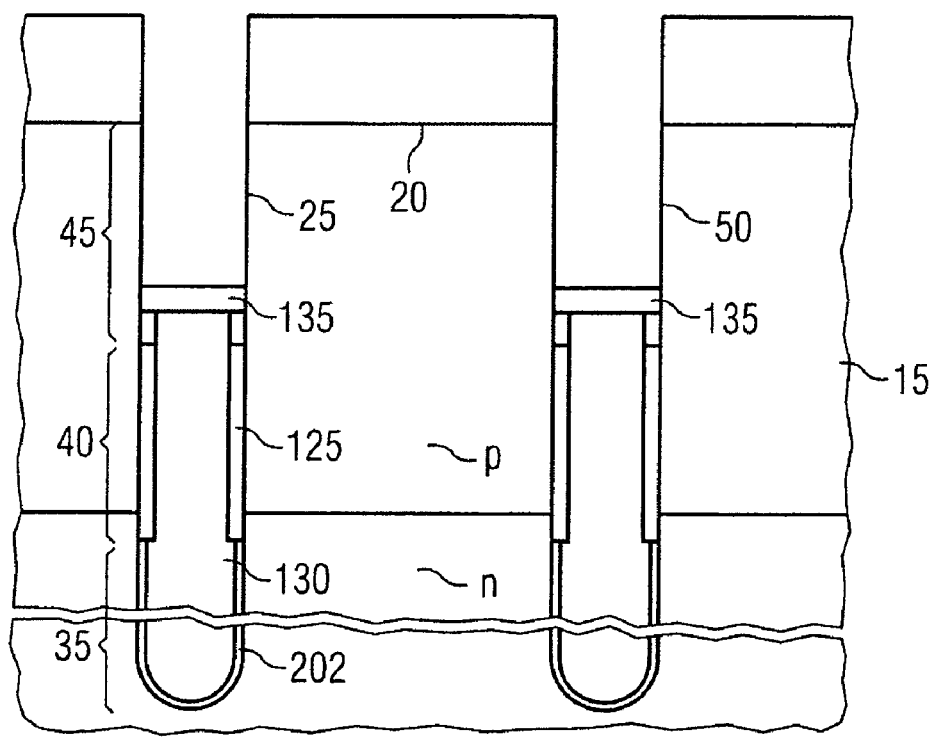

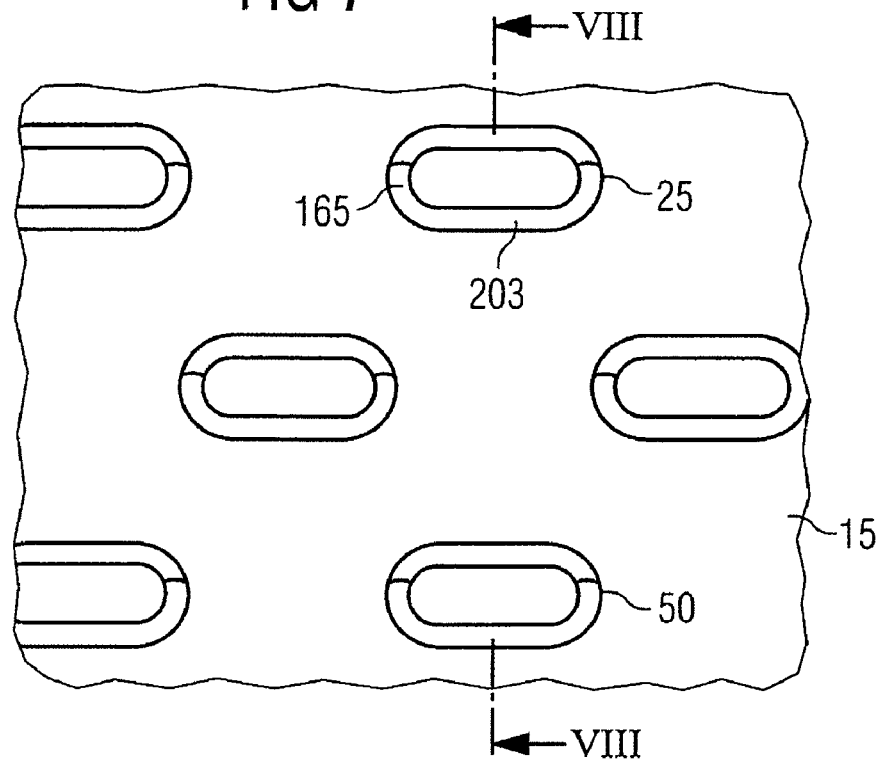
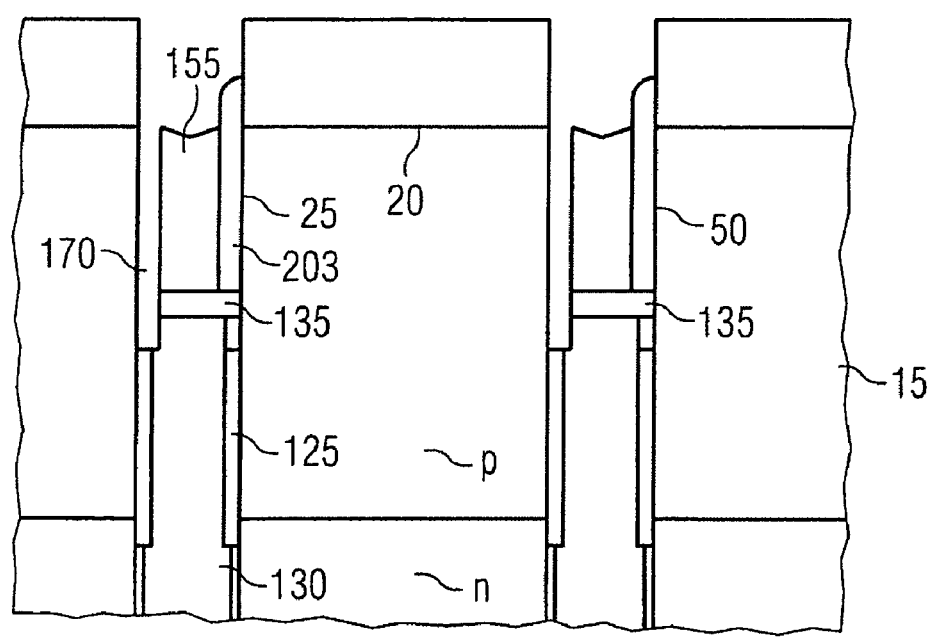

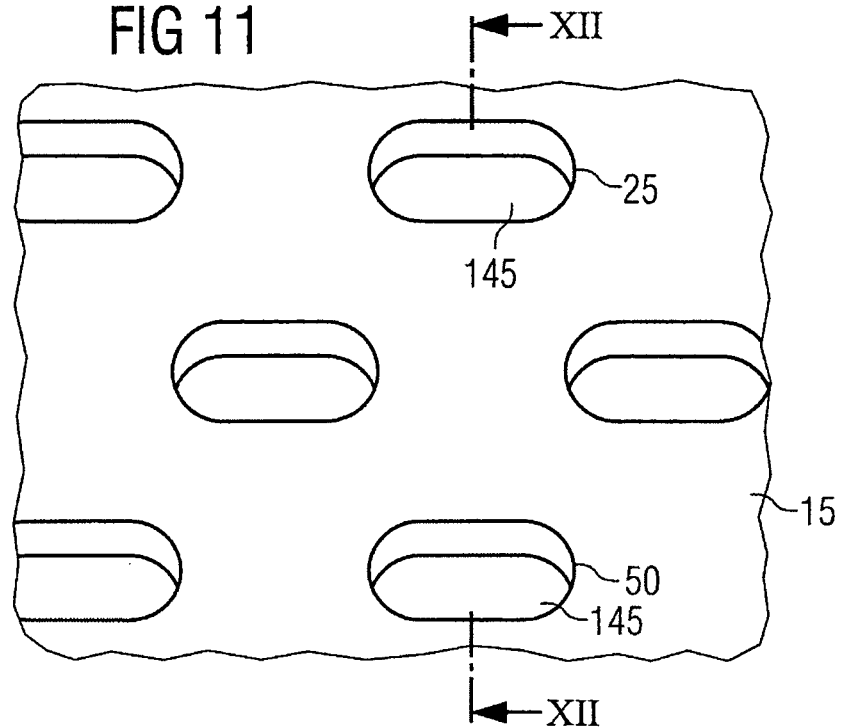
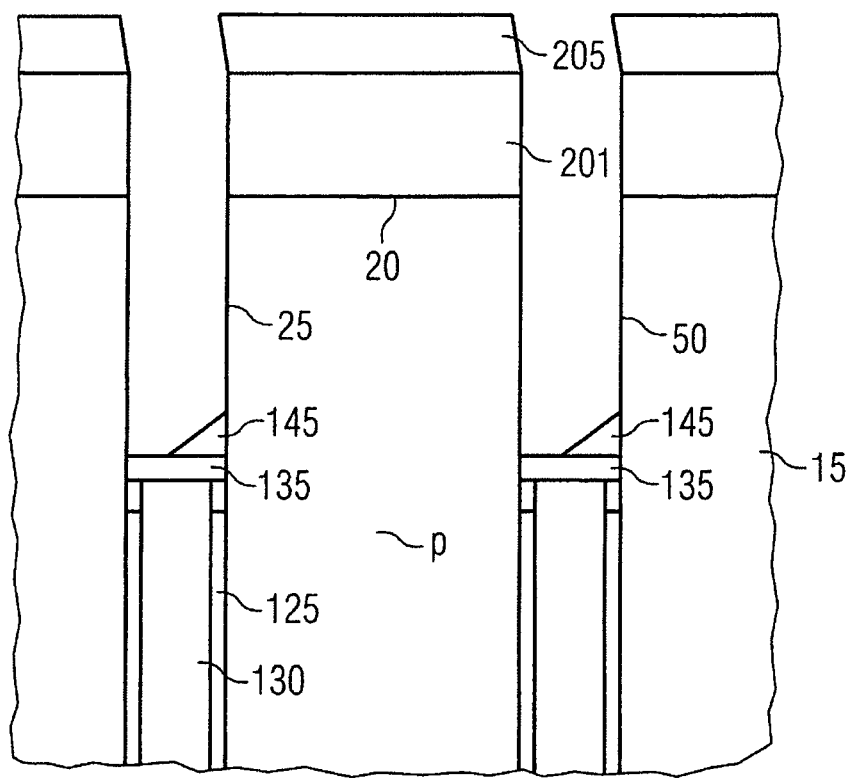

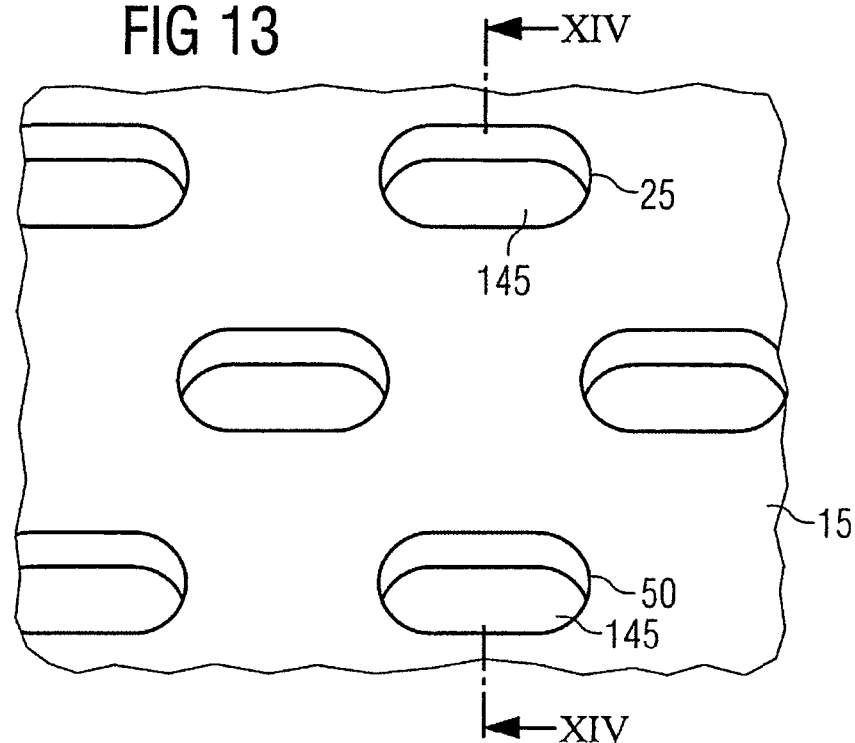
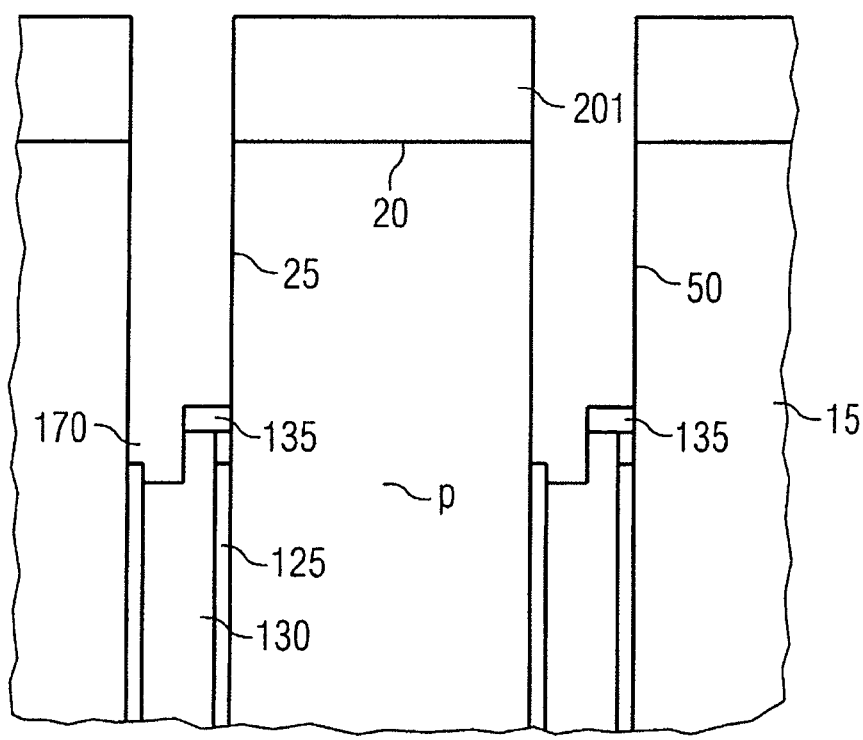

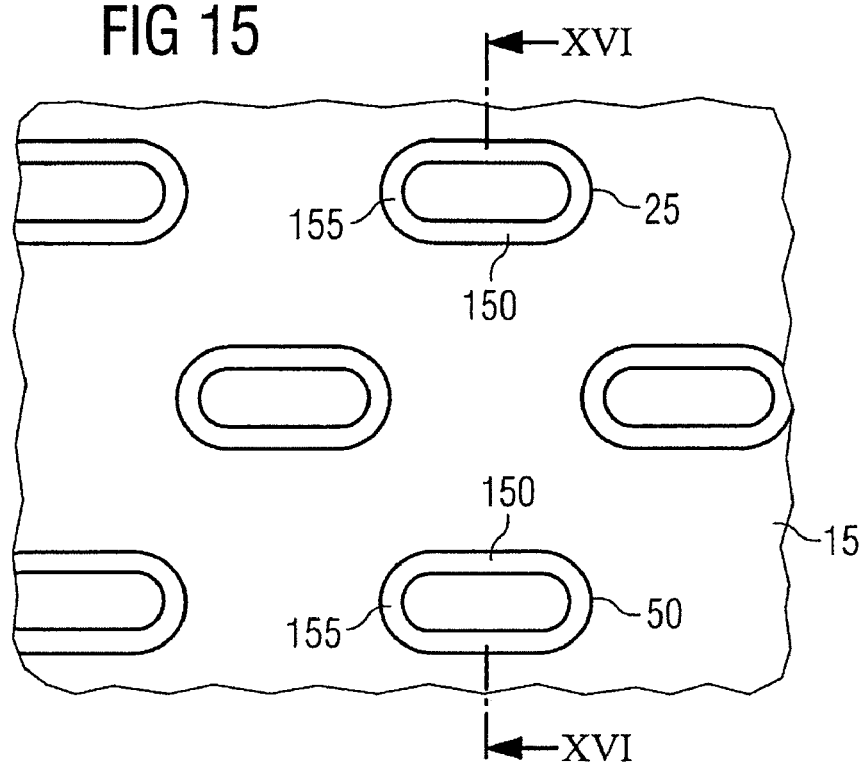
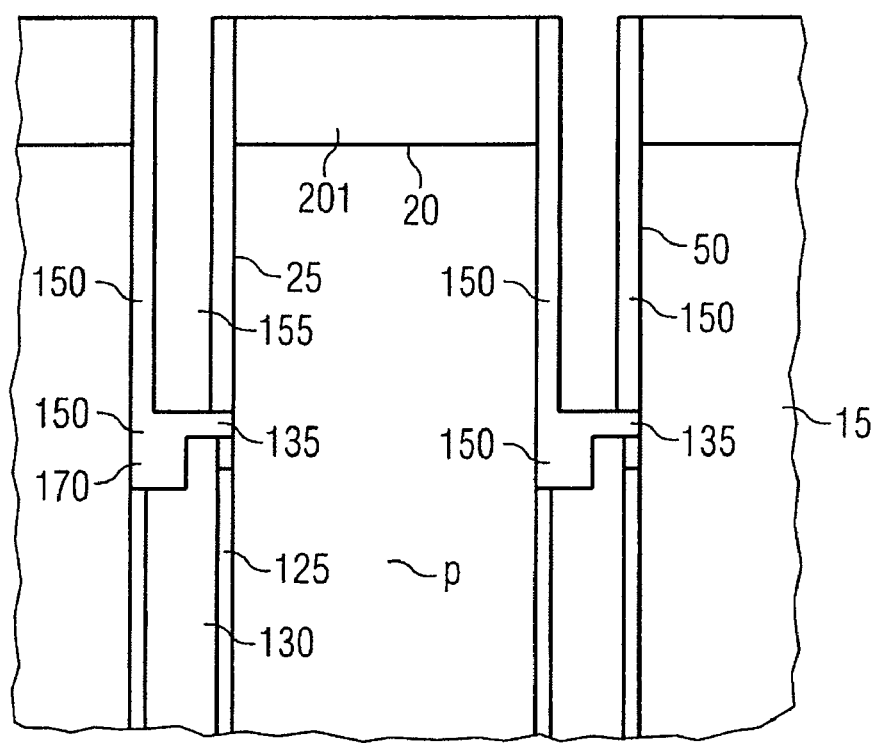

SEMICONDUCTOR MEMORY WITH MEMORY CELLS COMPRISING A VERTICAL SELECTION TRANSISTOR AND METHOD FOR FABRICATING IT

CROSS REFERENCE TO RELATED APPLICATIONS

This application is a continuation of PCT Application No. PCT/DE02/02980, filed on Aug. 14, 2002, and titled "Semiconductor Memory With Memory Cells Comprising A Vertical Selection Transistor And Method For Production Thereof," which claims priority from German Patent Application No. DE 10143650.5, filed on Sep. 5, 2001, and titled "Semiconductor Memory With Memory Cells Comprising A Vertical Selection Transistor And Method For Fabricating It," the entire contents of which are hereby incorporated by reference.

FIELD OF THE INVENTION

The present invention relates to a semiconductor memory with a trench capacitor and a vertical selection transistor, and to a method for fabricating it.

BACKGROUND

Semiconductor memories, such as, for example, DRAMs (Dynamic Random Access Memories), include a cell array and an addressing periphery. Individual memory cells are arranged in the cell array.

The cell array of a DRAM chip contains a matrix of memory cells which are arranged in the form of rows and columns and are addressed by word lines and bit lines. Data are read from the memory cells or data are written to the memory cells by the activation of suitable word lines and bit lines.

A memory cell of a DRAM usually contains a transistor connected to a capacitor. The transistor comprises, inter alia, two diffusion regions which are separated from one another by a channel controlled by a gate. One diffusion region is referred to as the drain region and the other diffusion region is referred to as the source region.

One of the diffusion regions is connected to a bit line. The other diffusion region is connected to a capacitor and the gate is connected to a word line. By the application of suitable voltages to the gate, the transistor is controlled in such a way that a current flow between the diffusion regions is switched on and off by the channel.

The advancing miniaturization of memory components means that the integration density continuously increases. The continuous increase in the integration density means that the area available per memory cell decreases ever further. This has the result that the selection transistor and the storage capacitor of a memory cell are subject to continual reduction of their geometrical dimensions.

Ongoing endeavours to reduce the size of the memory devices promote the design of DRAMs with a high density and a small characteristic size, such as a small area per memory cell. In order to fabricate memory cells which require a small surface region, use is made of smaller components, such as, for example, smaller capacitors. The use of capacitors reduced in size results in a lower storage capacitance of the individual capacitor, which may in turn adversely affect the functionality and usability of the memory device.

For example, sense amplifiers require a sufficient signal level for reliably reading out the information stored in the memory cells. The ratio of the storage capacitance to the bit line capacitance is crucial in determining a sufficient signal level. If the storage capacitance is too low, this ratio may be too small for generating an adequate signal for driving the sense amplifier. A lower storage capacitance likewise requires a higher refresh frequency.

Furthermore, it is known to arrange the selection transistor as a vertical selection transistor in the trench of the trench capacitor or above the trench of the trench capacitor. This likewise makes it possible to utilize the available substrate surface in a space-saving manner for memory cells.

In dynamic random access memories (DRAMs), nowadays use is made predominantly of so-called one-transistor cells. The latter comprise a storage capacitor and a selection transistor, which connects the storage electrode to a bit line. The storage capacitor is nowadays often formed as a so-called trench capacitor or stacked capacitor. For this purpose, usually a trench is etched into the substrate and a dielectric and an inner storage electrode are introduced into the trench.

Memory cells are known in which the selection transistor is arranged on the planar surface of the substrate, beside the trench capacitor. In order to realize a so-called folded bit line concept, such a memory cell requires a chip area of at least 8 $F^2$, where F represents the minimum periodic feature size of the lithographic imaging. A folded bit line concept makes it possible, for example, to evaluate very small signal levels which are fed from a memory cell to a sense amplifier via a bit line.

In order to ensure a folded bit line concept with a cell area of at most 8 $F^2$, a word line is permitted to have a maximum width of 1 F. Consequently, this means that a planar selection transistor can have a maximum channel length of 1 F. For subsequent technology generations, the lithography dimension F may be smaller than 100 nm so that corresponding selection transistors would have a channel length of less than 100 nm. This may result in the corresponding selection transistors having increased leakage currents due to their short channel length. Leakage currents can lead to a loss of the information stored in the memory cell.

Consequently, the problem exists of specifying a scalable memory cell concept with a maximum cell area of 8 $F^2$. One concern is that the electrical properties of the selection transistor and the corresponding interconnection as a folded bit line concept are not impaired. In addition to a channel length that is not too short, what should be avoided, in particular, are a decrease in the current-carrying capacity of the selection transistor and the mutual influencing of memory cells and a potential loss of information.

The channel length of the selection transistor may be, for example, a vertical selection transistor such that leakage currents are reduced or avoided. Various cell concepts with vertical selection transistors and various capacitor types have already been proposed.

If the selection transistor is formed with a minimum transistor width of 1 F, then this leads to an increase in the channel resistance, if the channel length is kept constant, since the ratio of transistor length to transistor width becomes ever greater as F decreases. This poses a problem, for instance, in concepts with a selection transistor whose channel width is formed merely with 1 F. There are examples of known concepts which solve this problem by a gate enclosing the active region. As a result, the channel width is formed larger than 1 F, for example, as described in U.S. Pat. No. 5,519,236, which, however does not describe a folded bit line concept.

The patterning and the alignment of the individual components with respect to one another is a problem in the realization of corresponding word lines which connect the gate electrodes enclosing the active region to one another. Since the gate electrodes enclosing the active region must be at a sufficient distance perpendicular to the word line in order to be insulated from one another. In known concepts, there is the need for lithographic patterning of the word line, as is carried out, for example, in U.S. Pat. No. 5,519,236. Due to the complicated alignment required, the lithographic patterning of the word lines leads to increased process costs and an increased space requirement, since it is necessary to comply with corresponding safety margins during the alignment and patterning.

A further group of cell concepts prevents the electrical connection of the active region, which leads to floating body effects. Floating body effects result if the active region, apart from the introduced source and drain regions, is insulated and electrical connection of the body (substrate) is not provided. Floating body effects limit the electrical properties, which, if appropriate, prevent the selection transistor from closing. As a result, a loss of information stored in the cell can occur due to leakage currents.

SUMMARY

A semiconductor memory with a memory cell can include a trench capacitor and a vertical selection transistor. A method for the fabrication of such a semiconductor memory can be provided.

A semiconductor memory can include a substrate, which has a substrate surface, a first trench, which is arranged in the substrate and has a lower region, a central region and an upper region and in which a trench capacitor is formed; a first direction and a second direction, which crosses the first direction; a second trench, which is arranged beside the first trench with respect to the first direction in the substrate and in which a trench capacitor is likewise formed; and a first longitudinal trench and a second longitudinal trench, which are arranged essentially parallel to one another and extend along the first direction. The first longitudinal trench can adjoin the first trench and the second trench and the second longitudinal trench can adjoin the first trench and the second trench on the opposite side of the first trench and the second trench with respect to the first longitudinal trench. The semiconductor memory can also include an active region, which is arranged between the first longitudinal trench, the second longitudinal trench, the first trench and the second trench; a first spacer word line, which is arranged in the first longitudinal trench laterally at the active region; a second spacer word line, which is arranged in the second longitudinal trench laterally at the active region; conductive connecting webs, which are arranged in the upper region of the first trench or of the second trench as a connection between the first spacer word line and the second spacer word line; and a vertical selection transistor, which has a source doping region, a drain doping region and a channel. The channel can be arranged between the source doping region and the drain doping region in the active region. The source doping region can be connected to the trench capacitor. The drain doping region can be connected to a bit line, which is arranged on the substrate and crosses the first spacer word line. The thickness of the connecting web in the direction of the course of the first spacer word line can be less than half the width of the first trench in the direction of the course of the first spacer word line.

The invention's arrangement and cell structure form a memory cell which enables a high packing density. In this case, for example, a vertical selection transistor in a DRAM memory cell with a cell area of 8 $F^2$ can be possible. Word lines which can enclose the active region, can be used. As a result, the active region can be shielded from adjacent word lines and bit lines so that significant influencing of adjacent memory cells or adjacent active regions and the selection transistors thereof is reduced or avoided. An active region enclosed by a gate electrode can be assigned to one selection transistor. The spacer word lines, formed as spacers, cab enable a self-aligned arrangement and patterning of the word lines. To fabricate them, a layer can be deposited conformally and can be etched back anisotropically. In the process, the word lines are formed as spacers from the layer. With this arrangement of the active region, the channel width of the vertical selection transistor may be 6.5 F, for example, instead of 1 F. The active region can be depleted. As a result, a selection transistor can be which enables the scalability of the selection transistor with respect to its electrical properties. An appropriately chosen extent of the source doping region connected to the trench capacitor can ensure an electrical connection to the active region. As a result, charge carriers can flow away and are not accumulated, in contrast to the floating body effect.

With a particular structure of the word lines, the arrangement according to the invention can enable a minimum pitch of the bit lines. Therefore, given a pitch of the word lines and bit lines of 2 F in each case, a cell area of 8 $F^2$ can be achieved. Larger distances between bit lines and word lines can be possible, which can likewise be used for a folded bit line concept. Sublithographic methods such as spacer techniques can be possible, which can be used to achieve cell areas of less than 8 $F^2$ in a folded bit line concept.

The semiconductor memory cell can provide for a first connecting web and a second connecting web to be arranged in the first trench. The first connecting web can adjoin the active region and the second connecting web can be arranged at a sidewall of the first trench opposite to the first connecting web in the upper region of the first trench. For example, a gate oxide can be arranged between the active region and the first connecting web. The gate oxide can insulate the first connecting web, acting as gate electrode, from the active region in which a channel of the selection transistor can be arranged. The arrangement of a first connecting web and a second connecting web can enable the connecting webs to be configured differently in order to achieve an optimized shielding of the active region from adjacent active regions or memory cells. Further advantages are that, with the aid of self-aligned processes, it can be possible to produce a geometry of the active region which has a large aspect ratio (large ratio between length and width) in the lateral dimensions. The process according to the invention can provide that the distance between the active regions can be relatively smaller in the direction of the larger extent, which runs along the word line, than in the direction which runs perpendicular thereto. For this purpose, for example, it is possible to fabricate spacer structures which enable a space-saving production of word lines without performing a lithographic definition of the dimensions of the word lines. The active region can be depleted in the case of the feature size sought, which is can be beneficial for the electrical properties of the selection transistor.

The semiconductor memory can provide for the active region to be enclosed by gate electrodes formed by the spacer word line and the connecting web. This can enable a surrounding gate which enables a good shielding of the active region from adjacent word lines. Furthermore, the selection transistor can be, for example, double-gated. As a result, its electrical properties can be improved.

The semiconductor memory can provide for a connecting web in each case to be arranged between two active regions. This enables a surrounding gate which enables a good shielding of the active region from adjacent word lines.

The semiconductor memory can provide for the second connecting web, proceeding from the substrate surface, to extend more deeply into the first trench than the first connecting web. This makes it possible to realize, for example, a shielding of a memory cell from adjacent memory cells that is improved on one side, since electric fields proceeding from the adjacent memory cell are absorbed by the second connecting web, projecting more deeply into the substrate, on account of its conductivity. This enables an improved shielding between adjacent memory cells, thereby reducing the crosstalk between adjacent memory cells and the mutual influencing. Moreover, the second connecting web can also act as gate electrode and contribute to the control of a selection transistor.

A further advantageous refinement of the semiconductor memory cell according to the invention provides for an insulation collar to be arranged on the side wall of the trench in the central region of the trench. The insulation collar serves for insulating the conductive trench filling from the substrate surrounding the trench. Moreover, the thickness of the insulation collar reduces the control action of the conductive trench filling on the surrounding substrate, as a result of which leakage currents can be avoided.

A further advantageous refinement of the semiconductor memory according to the invention provides for a conductive trench filling to be arranged as inner capacitor electrode of the trench in the lower region and the central region of the trench. The conductive trench filling can be referred to as node electrode or storage node. It is the inner capacitor electrode, which is insulated by an insulating layer, which is a dielectric layer, for example, from the substrate which surrounds the trench and in which the outer capacitor electrode is arranged by an introduced increased dopant concentration.

The semiconductor memory according to the invention can provide for an insulating layer to be arranged on the conductive trench filling, The insulating layer can extend from the first connecting web to the second connecting web and has an angled course at the second connecting web so that it covers the second connecting web along a longer distance than the first connecting web. The angled course of the insulating layer makes it possible to arrange a buried strap as conductive connection between the conductive trench filling and the source doping region of the selection transistor asymmetrically in the trench. This can be formed in the vicinity of the sidewall at which the source doping region of the selection transistor can be arranged. Consequently, both a low-resistance electrical connection to the source doping region of the selection transistor and a good insulation from the remaining regions of the trench capacitor can be provided.

The semiconductor memory according to the invention can provide for the insulation collar along the periphery of the first trench to have a relatively uniform distance from the substrate surface. The essentially uniform distance between the insulation collar and the substrate surface means that the buried strap can be arranged above the insulation collar and can be insulated from adjacent structures with the angled course of the insulating layer.

A method for fabricating a semiconductor memory can include providing a substrate, which has a substrate surface having a first direction and a second direction, which crosses the first direction; forming a first trench in the substrate, which has a lower region, a central region and an upper region; forming a second trench in the substrate, which is arranged beside the first trench with respect to the first direction; and forming a first longitudinal trench and a second longitudinal trench, which run essentially parallel to one another and extend along the first direction. The first longitudinal trench can adjoin the first trench and the second trench and the second longitudinal trench can adjoin the first trench and the second trench at the opposite side of the first trench and the second trench with respect to the first longitudinal trench. An active region can be formed between the first longitudinal trench, the second longitudinal trench, the first trench and the second trench. The method can also include forming a first spacer word line in the first longitudinal trench, laterally at the active region; forming a second spacer word line in the second longitudinal trench, laterally at the side wall of the active region opposite to the first spacer word line; forming conductive connecting webs in the upper region of the first trench or of the second trench between the first spacer word line and the second spacer word line so that the first spacer word line is connected to the second spacer word line; forming a trench capacitor in the first trench; and forming a vertical selection transistor. The vertical transistor can have a source doping region, a drain doping region and a channel. The channel can be formed between the source doping region and the drain doping region in the active region and the source doping region can be connected to the trench capacitor and the drain doping region being connected to a bit line, which is formed on the substrate and crosses the first spacer word line. The connecting webs in the direction of the course of the first spacer word line can be formed with a thickness which is less than half the width of the first trench in the direction of the course of the first spacer word line.

The method according to the invention forms the connecting webs in the direction of the first spacer word line with a small thickness. T his is possible, for example, using sublithographic techniques, such as a spacer technique, a structure which prescribes the thickness of the connecting webs being formed by means of a spacer. The connecting webs can be formed in the same process step as the spacer word lines, thereby enabling process costs to be saved.

The method according to the invention can provides for a conductive trench filling to be filled into the lower region of the trench as inner capacitor electrode.

The method according to the invention can provide for an insulation collar to be formed in the central region of the first trench on the side wall of the first trench and the conductive trench filling to be subsequently filled into the central region of the first trench.

The method according to the invention can provide for a first insulating layer to be arranged on the conductive trench filling.

The method according to the invention can provide for a first mask layer to be deposited by directional deposition in the first trench onto the first insulating layer at an angle which is tilted relative to a perpendicular normal to the substrate surface such that the first insulating layer is partially covered with the first mask layer and partially remains free; an etching of the first insulating layer masked by the first mask layer to be carried out, part of the conductive trench filling likewise being removed; and a second insulating layer to be deposited conformally in the first trench and the first trench to be filled with a first filling material.

The mask can be fabricated without the use of a further lithography step. Since the mask produced can be produced in a self-aligned manner with respect to the structure of the trench, it can be free of alignment errors which usually occur in lithographic imaging processes. It is possible to employ known and established and cost-effective methods such as PVD (Physical Vapour Deposition) and I-PVD (Ionized Physical Vapour Deposition). In this case, the mask structure can be deposited in a self-aligned manner in the trench, on one side on the insulating layer. In this case, directional deposition means that the angular distribution of the deposited particles can be less than 10°. The angular deviation of the deposited particles from the main direction of the deposition can be less than 5°. The shadowing effect of the trench, which occurs in the case of a deposition carried out obliquely relative to the trench direction, can be used for the production of the mask. Some of the particles to be deposited can be masked out by the geometrical form of the trench and, consequently, do not reach the insulating layer.

A method can also provide a silicon layer to be deposited conformally in the first trench and to be etched back so that a tubular silicon spacer can be formed on the sidewall of the first trench above the first insulating layer; the silicon spacer to be doped on one side by a directional implantation, the substrate being tilted with respect to the implantation direction such that one side of the silicon spacer can be doped and the other side remains essentially unchanged; the silicon spacer to be etched selectively depending on its dopant concentration and, in the process, to be partially removed from the first insulating layer; and the uncovered first insulating layer to be etched, the conductive trench filling being uncovered, and the conductive trench filling to be etched, thereby forming a depression in the first trench.

A self-aligned process which uses the geometrical arrangement of the trench capacitor and of the tubular silicon spacer to produce a mask or etching mask on one side in the trench on the first insulating layer can be used. The silicon spacer can subsequently be used for the patterning of the buried strap. As a result of the inclined, one-sided implantation, the silicon spacer can be provided with different dopant concentrations and types, as a result of which a selective etching process enables a self-aligned, one-sided formation of the buried strap (conductive connection) of the vertical cell transistor to the trench capacitor.

The invention is explained in more detail below with reference to exemplary embodiments and figures.

BRIEF DESCRIPTION OF THE DRAWINGS

In the figures, identical reference symbols designate identical or functionally identical elements.

FIG. 1 illustrates a plan view of a substrate in which trenches are arranged;

FIG. 2 is a sectional view of FIG. 1 taken along the section line II—II;

FIG. 3 illustrates a plan view of the substrate in accordance with FIG. 1;

FIG. 4 is a sectional view of FIG. 3 taken along the section line IV—IV;

FIG. 7 illustrates a plan view in accordance with FIG. 5;

FIG. 8 is a sectional view of FIG. 7 taken along the section line VIII—VIII in which the differently doped, tubular silicon spacer has been particularly selectively removed;

FIG. 11 illustrates a plan view of a substrate in accordance with a further process variant which follows FIG. 3;

FIG. 12 is a sectional view of FIG. 11 taken along the section line XII—XII;

FIG. 13 illustrates a plan view of a substrate in accordance with FIG. 11;

FIG. 14 is a sectional view of the substrate of FIG. 13 taken along the section line XIV—XIV;

FIG. 15 illustrates a the plan view of a substrate in accordance with FIG. 13 in which further layers can be formed in the trench;

FIG. 16 is a sectional view of FIG. 15 taken along the section line XVI—XVI;

DETAILED DESCRIPTION

Figure 5:
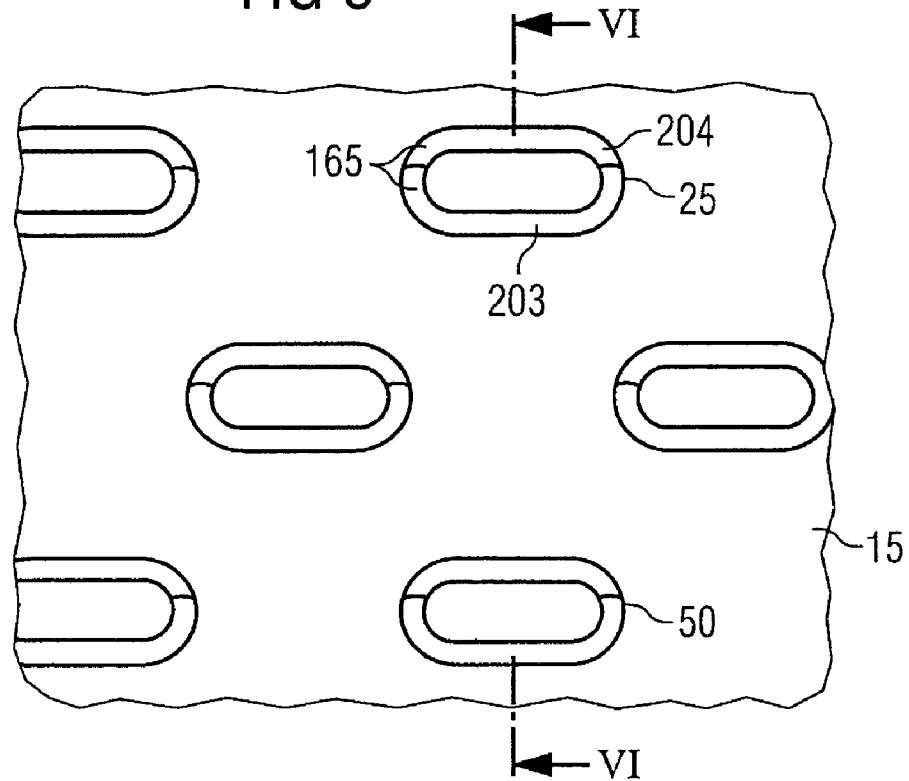
FIG. 5 illustrates a plan view of the substrate in accordance with FIG. 3, with a tubular silicon spacer arranged in the first trench.
Figure 6:
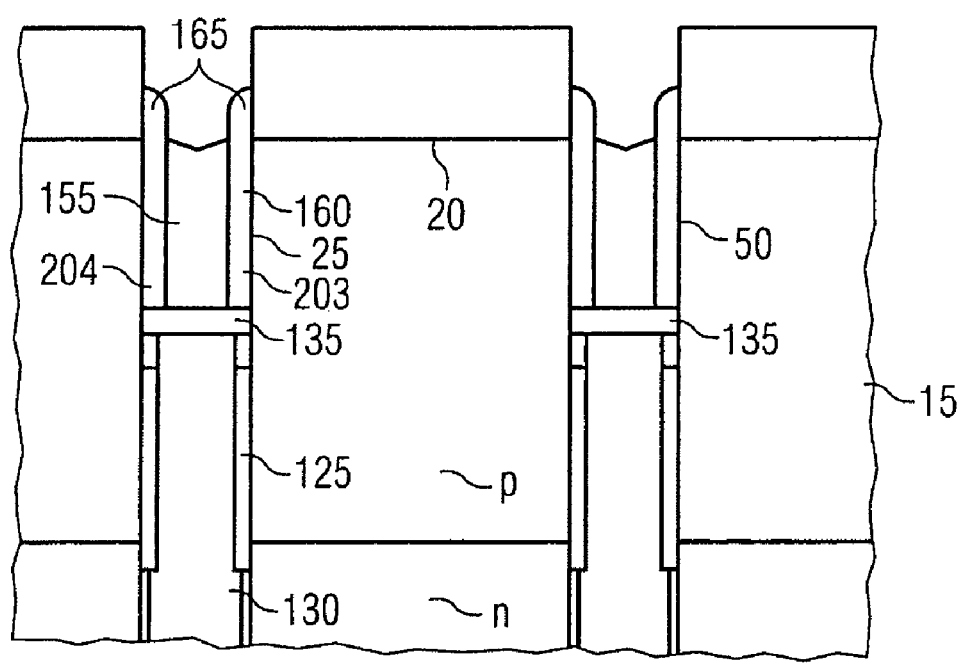
FIG. 6 is a sectional view of FIG. 5 taken along the section line VI—VI.

FIG. 1 illustrates a substrate 15, in which a first trench 25 can be arranged. A second trench 50 can be arranged adjacent to the first trench 25. The substrate 15 can be formed from p- or n-doped silicon. For example, the substrate 15 can have p-doped silicon with a dopant concentration of approximately $10^{15}$ doping atoms/cm$^3$. The surface of the substrate can have a first direction X and a second direction Y, which crosses the first direction X.

With reference to FIG. 2, the illustration shows a sectional diagram along the section line II from FIG. 1. The substrate 15 can have a substrate surface 20 and the first trench 25 and the second trench 50 can be arranged in the substrate 15. The substrate 15 can have a buried n-doped layer. In order to form the first trench 25 and the second trench 50 in the substrate 15, for example, a silicon oxide layer having a thickness of approximately 8 nm can be formed on the substrate surface 20 and a silicon nitride 201 having a thickness of about 200 nm can then be deposited. Optionally, a BPSG (borophosphorsilicate glass) layer having a thickness of approximately 800 nm can be deposited onto the silicon nitride 201 and a resist mask can be deposited and patterned by means of phototechnology. Afterward, by the patterned resist mask, the silicon oxide layer can be patterned, for example, using $CHF_3$ and $O_2$ and the silicon nitride layer 201 can be patterned using $C_2F_6$ and $O_2$. The resist mask can be removed and the first trench 25 and the second trench 50 can be etched, for example, with a depth of 10 μm using the substances HBR+HF, by the patterned oxide layer and nitride layer, which can be referred to as pad nitride and pad oxide. Afterward, the pad oxide can be removed using hydrofluoric acid, for example. An arsenic glass layer having a thickness of approximately 20 nm is deposited into the first trench 25. The trench can subsequently be filled with a polymer layer made of PMMA (polymethylmethacrylate) having a thickness of approximately 500 nm which can subsequently be sunk into the trench. The arsenic glass layer is then removed from the upper region of the trench by hydrofluoric acid and the polymer is subsequently removed from the entire trench by an oxygen plasma. The n-type dopant can be outdiffused from the arsenic glass layer into the substrate and can form a buried plate which is used as outer electrode of the trench capacitor. The arsenic glass layer can subsequently be removed from the trench by hydrofluoric acid. The trench capacitor can likewise be formed in a bottle-shaped trench having a widened lower region in order thus to obtain a larger capacitance.

FIG. 3 illustrates a further plan view of the substrate 15, which shows the first trench 25 and the second trench 50. The first trench 25 can have a periphery 140.

With reference to FIG. 4, the illustration shows a sectional diagram along the section line IV. The first trench 25 can have a lower region 35, a central region 40 and an upper region 45. The lower region 35 of the first trench 25 can extend from the deepest point of the first trench as far as the lower edge of an insulation collar 125 arranged in the central region 40. The upper region 45 can be formed above the central region. A vertical selection transistor can subsequently be formed in the upper region. A capacitor dielectric 202 having a thickness of approximately 3 nm can include the layer sequence silicon oxide, silicon nitride and silicon oxide, is formed in the lower region 35 of the trench 25. A conductive trench filling 130 is subsequently deposited into the lower region 35 and the central region 40 of the trench 25, which trench filling contains polycrystalline silicon, for example, and can be n-doped. Afterward, the conductive trench filling 130 can be sunk into the trench 25 to a depth of approximately 2 μm, as a result of which the upper region 45 of the trench 25 can be freed of the conductive trench filling 130.

The capacitor dielectric 202 can be removed from the upper region 45 and the central region 40 and an insulation collar 125 can be formed in the central region 40 and the upper region 45 with a thickness of approximately 20 nm by a TEOS (tetraethyl orthosilicate) deposition. By an anisotropic etching, the insulation collar 125 can be formed firstly in the upper region 45 and the central region 40 as an annular spacer. The anisotropic etching etches, for example, 20 nm of silicon oxide using $CHF_3$ and oxygen as etching substances. Afterward, polycrystalline, n-doped silicon can be deposited again, which forms a further partial region of the conductive trench filling 130. The polycrystalline silicon can be sunk into the first trench 25 to a depth of approximately 800 nm and the insulation collar 125 can be removed from the upper region 45 of the trench 25. The insulation collar 125 can thus be formed in the central region 40 of the trench 25.

Afterward, an insulating layer 135 can be formed as a trench top oxide with a thickness of approximately 40 nm on the conductive trench filling 130. The insulating layer 135 is optional. The insulating effect can likewise be achieved by a pn junction between the subsequently formed filling 155 and the insulating layer 135. Equally, a subsequently formed gate oxide can be suitable as insulation between the conductive trench filling and subsequent layers.

A polycrystalline and undoped silicon layer having a thickness of approximately 20 nm can be deposited. An annular silicon spacer 165 can be formed from the deposited silicon layer by anisotropic etching. Afterward, an implantation can be carried out during which the implantation angle can be tilted relative to the normal to the substrate, thereby achieving a one-sided implantation of the tubular silicon spacer 165. After the implantation, the tubular silicon spacer 165 can have a first part 203 and a second part 204. For example, the first part 203 can be implanted with p-type dopant or, as an alternative, the second part 204 can be implanted with n-type dopant.

Afterward, a first filling material 155 made, for example, of silicon oxide can be formed by a TEOS deposition in the tubular silicon spacer 165. A selective etching of the tubular silicon spacer 165 can be performed, the second part 204 being removed, depending on the doping of the first part 203 and of the second part 204. For example, if the first part 203 is p-doped and the second part 204 is intrinsic, then the intrinsic second part 204 can be removed by the selective etching. As an alternative, if the second part 204 is n-doped and the first part 203 is intrinsic, then the n-doped second part 204 can be removed by a selective etching and the intrinsically doped first part 203 remains. Consequently, the second part 204 can be removed in both cases. This is illustrated, for example, in connection with FIGS. 7 and 8.

FIG. 7 illustrates a plan view in which the second part 204 has already been removed.

FIG. 8 illustrates a sectional diagram along the section line VIII from FIG. 7. The second part 204 has already been removed, a part of the first insulating layer 135 and a part of the conductive trench filling 130, which were in each case arranged below the second part 204, likewise having been removed. In this case, a depression 170 has been formed in the trench, which depression can be arranged in a partial region of the first trench 25.

A method for fabricating a structure which corresponds to that in FIG. 8 is illustrated with reference to FIG. 9. In this case, FIG. 9 follows FIG. 4 and shows a corresponding plan view of the substrate 15. For example, the first trench 25, in which the trench capacitor 35 is arranged, is formed in a manner deviating from a rotational symmetry, the trench length being approximately 2 F and the trench width being approximately 1 F. The dimensions of the trench 25 are not restricted to these values.

Figure 9:
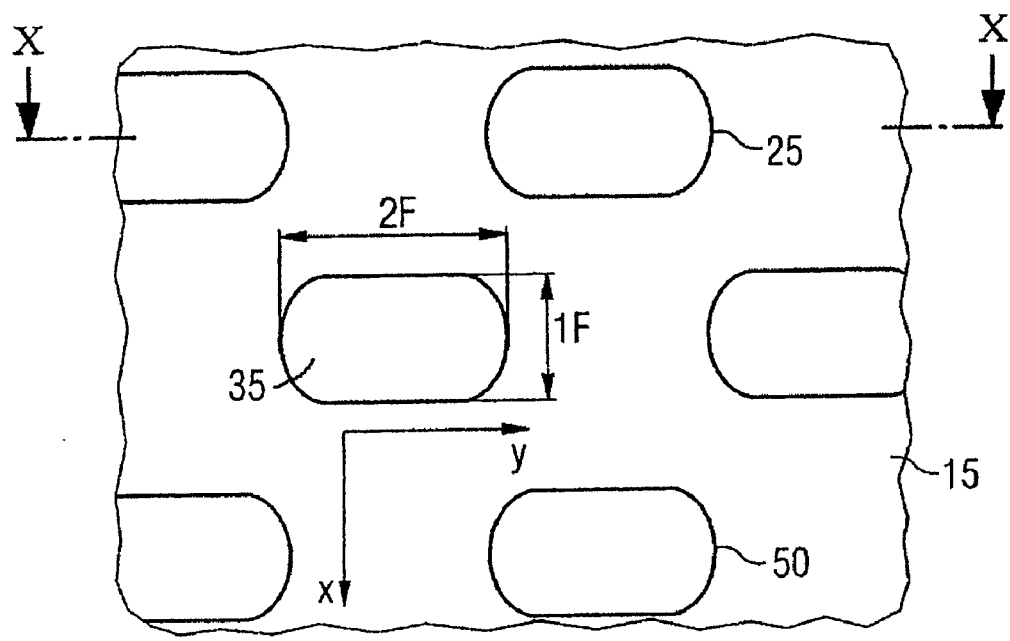
FIG. 9 illustrates a plan view of a substrate in accordance with FIG. 7.
Figure 10:
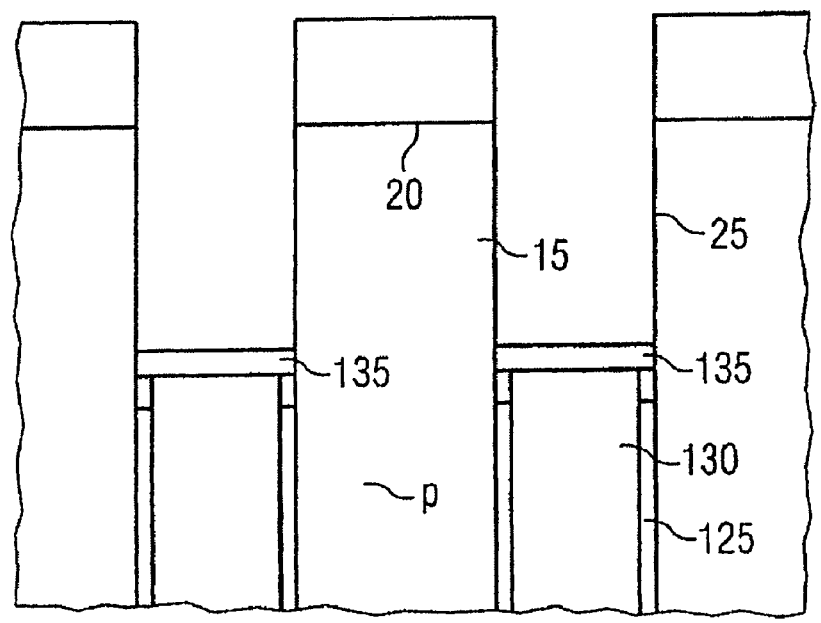
FIG. 10 is a sectional view of FIG. 9 taken along the section line X.

With reference to FIG. 10, the illustration shows a sectional diagram along the section line X from FIG. 9. In contrast to FIG. 4, FIG. 10 illustrates a section along the second direction Y.

FIG. 11 illustrates the plan view of the substrate 15 in which a first mask layer 145 can be deposited.

FIG. 12 illustrates a sectional diagram along the section line XII from FIG. 11. The first mask layer 145 can be formed as a self-aligned mask structure, for example, from amorphous silicon. To that end, a PVD (Physical Vapour Deposition) method is used in which the direction of the deposition can be tilted relative to the normal to the substrate, so that the first mask layer can be formed on a first part of the first insulating layer 135 and leaves free a second part of the first insulating layer 135. During the deposition, a mask layer 205 can be formed on the silicon nitride layer 201.

According to the invention, three different PVD methods may alternatively be used. Firstly, it is possible to carry out a collimated PVD, which is known, for example, for producing diffusion barriers from titanium or titanium nitride and is described by Powell and Rossnagel: "Thin Films", Academic Press, ISBN: 0-12-533026-X, 1999, pages 191 to 195. A silicon target is used which is also suitable for the sputtering of amorphous silicon. A collimator can be required, which should have an aspect ratio between opening and length of the order of magnitude of 1 to 5, so that the angular distribution of the deposited particles has at most a deviation of 5° from the deposition direction. For this purpose, for example, it is possible to modify a customary collimator with an aspect ratio of 1 to 1.5 such that it has an aspect ratio of less than 0.2.

A second method for carrying out the directional deposition with a small angular distribution consists in the Long Throw PVD, described by Powell and Rossnagel: "Thin Films", ISBN: 0-12-533026-X, 1999, pages 195 to 213. The publication by Butler et al., "Long throw and ionized PVD", Solid state technology, ISSN 0038-111X, pages 183 to 190, also describes this. For this purpose, a silicon target is likewise used, although the distance between sputtering target and surface of the wafer can be increased. For example, distances of 2 m or more are necessary in order to limit the angular distribution of the deposited particles to a deviation of at most 5° with respect to the deposition direction. Standard methods can use distances of approximately 0.5 m.

A third method for deposition is the I-PVD (Ionized Physical Vapour Deposition), which likewise uses a silicon target. In contrast to normal PVD methods, approximately 80% of the deposited particles can be ionized in the case of I-PVD. If a grid electrode, which is transparent to the deposited particles, can be inserted between the region of the high-frequency plasma and the surface of the substrate, then it is possible to achieve an angular distribution of the deposited particles with a distribution of less than 5° deviation from the deposition direction. Examples of a suitable grid electrode are a plate with holes or a wire net whose grid width is between 10 μm and 1 mm, i.e., 100 μm. For example, a bias voltage of between 20 V and 200 V can be applied to the grid electrode. This can accelerates the ions to be deposited in the direction of the substrate and the angular distribution can be reduced. Standard methods usually apply the bias voltage directly to the wafer.

In the three exemplary methods, the substrate can be tilted in a suitable manner relative to the deposition direction so that the first mask layer 145 can be formed in a self-aligned manner on one side on the first insulating layer 135 as a result of the shadowing effects of the first trench 25. The suitable tilt angle depend on the aspect ratio of the trench at whose bottom the first mask layer 145 can be formed. For trenches with an aspect ratio (AR) between trench depth and trench diameter of approximately 5, tilt angles of between 4° and 8° can be suitable, i.e., a tilt angle of 6°. Generally, the tilt angle should be approximately arctan(1/(2AR)).

With the three variants according to the invention for the formation of the first mask layer 145, the first mask layer 145 can be formed from amorphous silicon in a wedge-shaped manner on the first insulating layer 135.

With reference to FIG. 13, the illustration shows the plan view of the substrate 15.

FIG. 14 illustrates a sectional diagram along the section line XIV from FIG. 13. The first mask layer 145 has been used as an etching mask during the patterning of the first insulating layer 135. This can produce depression 170, which takes up a part of the original first insulating layer 135 and a part of the conductive trench filling 130. FIG. 14 corresponds structurally to FIG. 8, but differs in detail by virtue of the first part 203 of the tubular silicon spacer 165 and the first filling material 155 of FIG. 14. Afterward, process steps are carried out which initially further increase the similarity to FIG. 8, so that a starting point can be reached from which the subsequent patterning and further treatment can be regarded as equivalent for both exemplary embodiments.

FIG. 15 illustrates the plan view of the substrate 15 in which a second insulating layer 150 can be deposited as a conformal layer with a thickness of about 0.25 F by a TEOS deposition. The trench can subsequently be filled with the first filling material 155, which may be composed of amorphous silicon, for example.

FIG. 16 illustrates a sectional diagram along the section line XVI from FIG. 15. In this case, the depression 170 can be filled with the second insulating layer 150.

The subsequent method steps can then be carried out correspondingly for both exemplary embodiments. A hard mask 206 is placed in strip form in the first direction X over the first trench 25 and the second trench 50. The hard mask 206 serves for patterning an active region 65.

Figure 17:
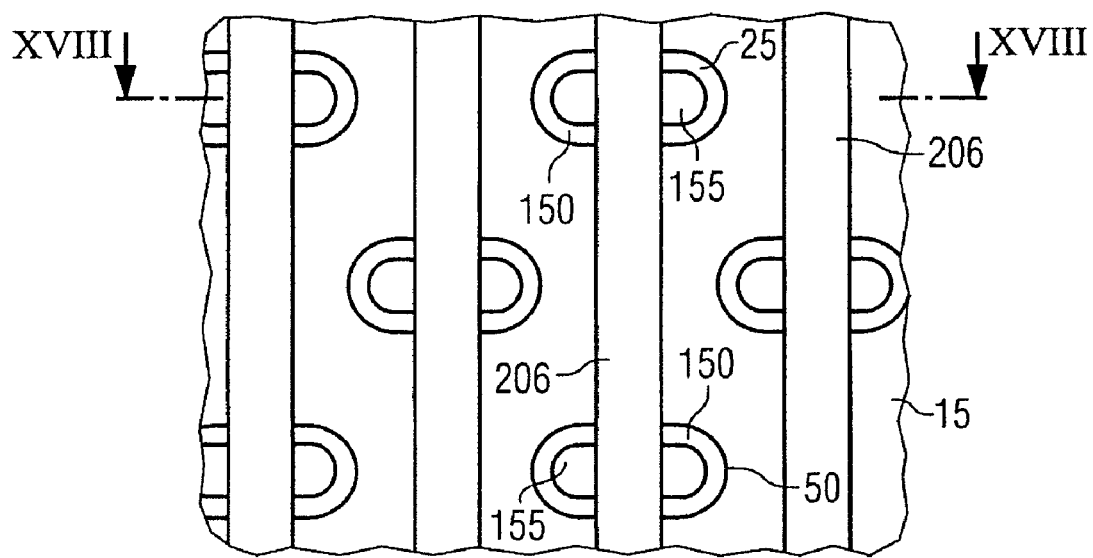
FIG. 17 illustrates a plan view of a substrate in accordance with FIG. 15 in which additional masks can be arranged.
Figure 18:
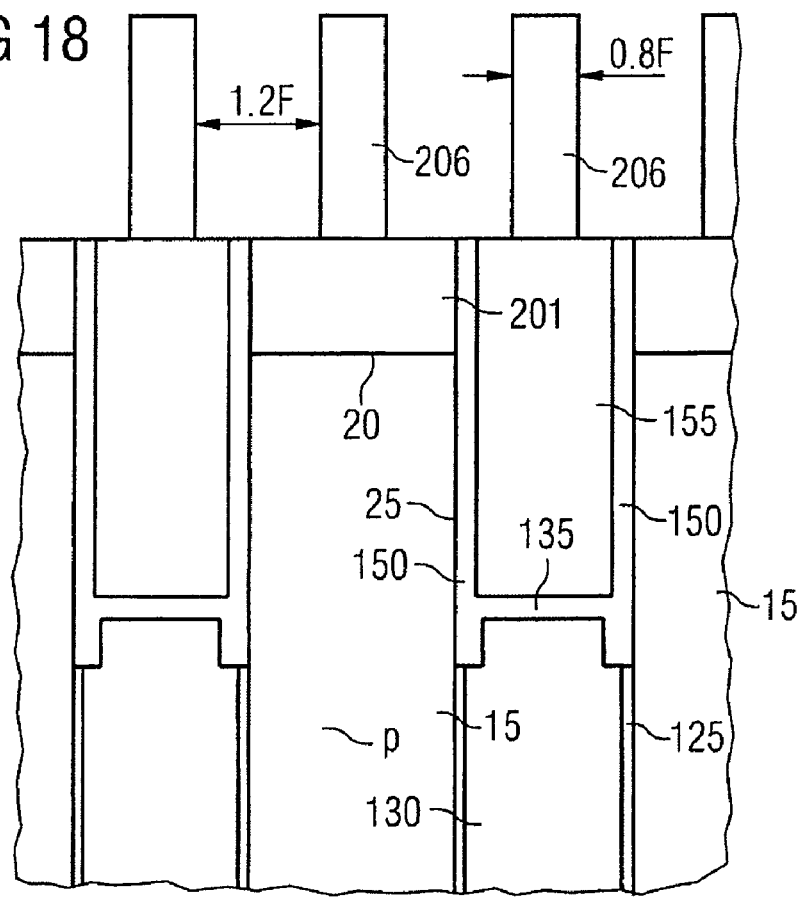
FIG. 18 is a sectional view of FIG. 17 taken along the section line XVIII—XVIII.

FIG. 18 illustrates a sectional diagram along the section line XVIII from FIG. 17. The hard mask 206 can have, for example, a width of 0.8 F and a mutual spacing of approximately 1.2 F.

Figure 19:
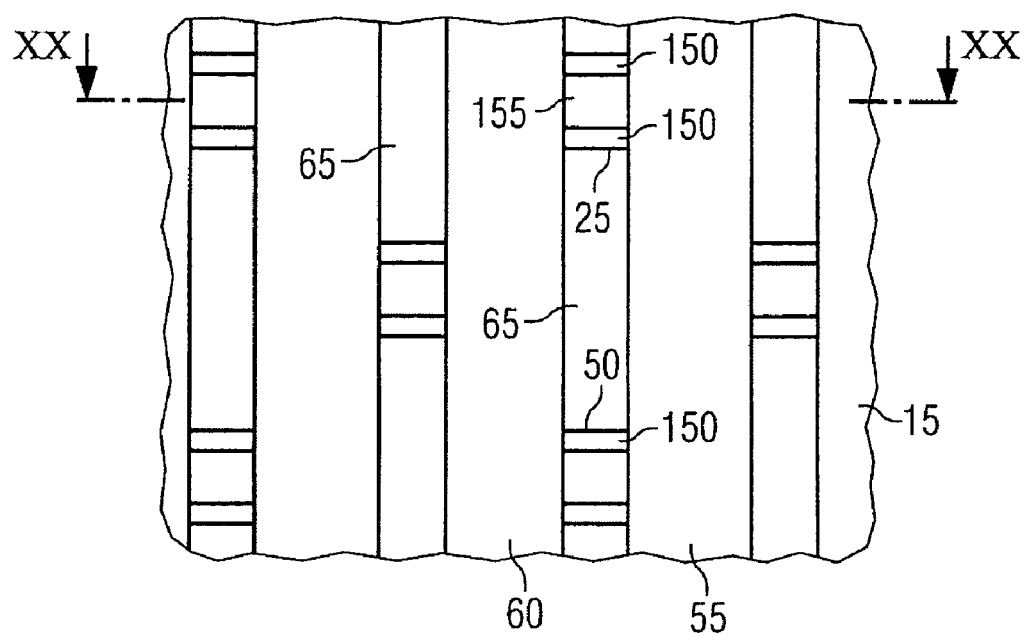
FIG. 19 illustrates a plan view according to FIG. 17 in which an etching using the mask arranged in FIG. 17 having been carried out.

With reference to FIG. 19, the illustration shows the plan view of a substrate 15 patterned by the hard mask 206. In this case, there can be formed laterally beside the first trench 25 and the second trench 50 a first longitudinal trench 55 and, on the opposite side of the trenches 25 and 50, a second longitudinal trench 60. An active region 65 can be formed between the first longitudinal trench 55, the second longitudinal trench 60, the first trench 25 and the second trench 50.

Figure 20:
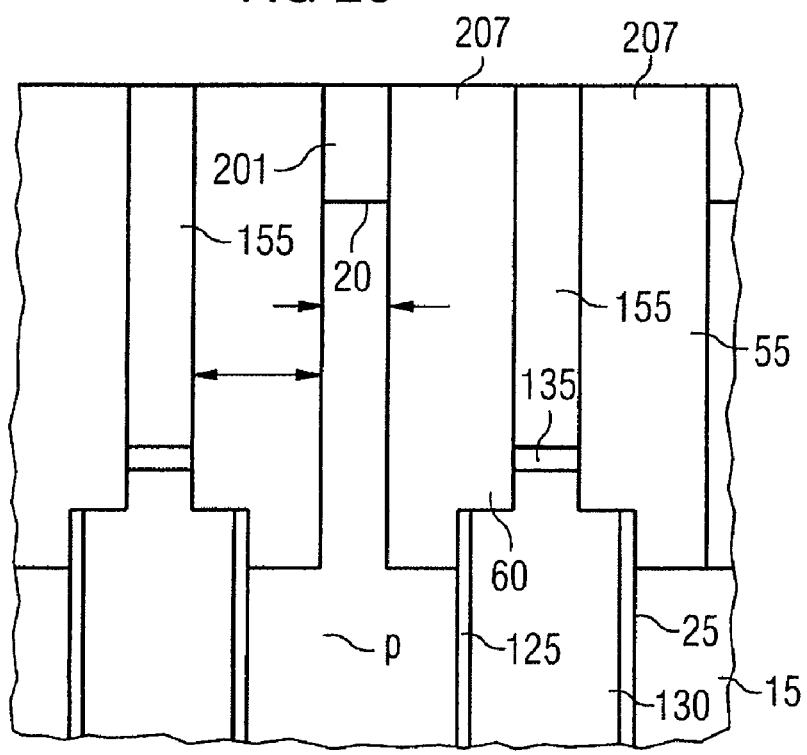
FIG. 20 is a sectional view of FIG. 19 taken along the section line XX—XX.

FIG. 20 illstrates a section diagram along the section line XX from FIG. 19. The first longitudinal trench 55 and the second longitudinal trench 60 can be filled with a second filling material 207. The second filling material can be silicon oxide, for example.

Figure 21:
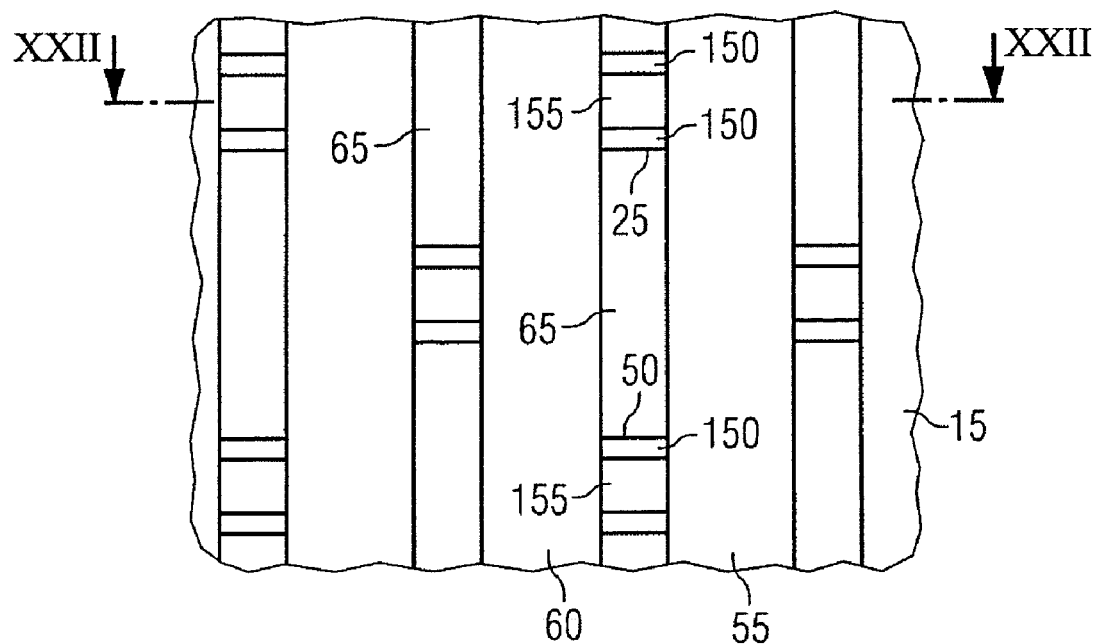
FIG. 21 illustrates a plan view according to FIG. 19.

With reference to FIG. 21, the second filling material 207 can be partially sunk into the first longitudinal trench 55 and the second longitudinal trench 60, so that a part of the second filling material 207 can remain at the bottom of the first longitudinal trench 55 and at the bottom of the second longitudinal trench 60.

Figure 22:
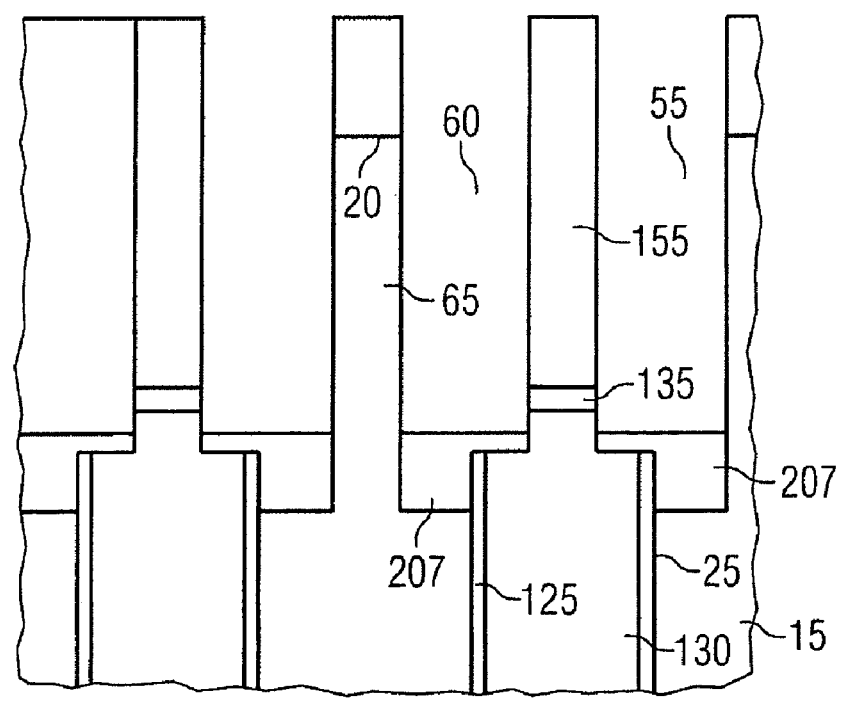
FIG. 22 is a sectional view of FIG. 21 taken along the section line XXII—XXII.

FIG. 22 illustrates a sectional diagram along the section line XXII from FIG. 21 in which the sinking of the second filling material 207 is illustrated.

Figure 23:
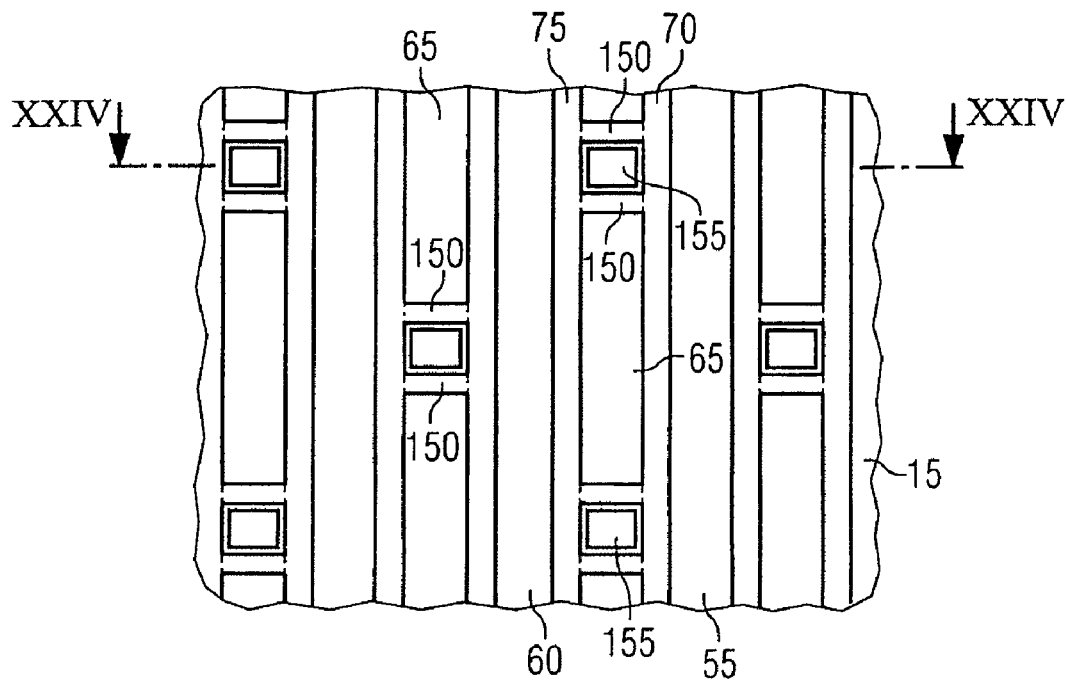
FIG. 23 illustrates a plan view of a substrate in accordance with FIG. 21 in which spacer word lines can be arranged.

FIG. 23 illustrates the plan view of the substrate 15 in which a first spacer word line 70 can be formed in the first longitudinal trench 55 and a second spacer word line 75 can have formed in the second longitudinal trench 60.

Figure 24:
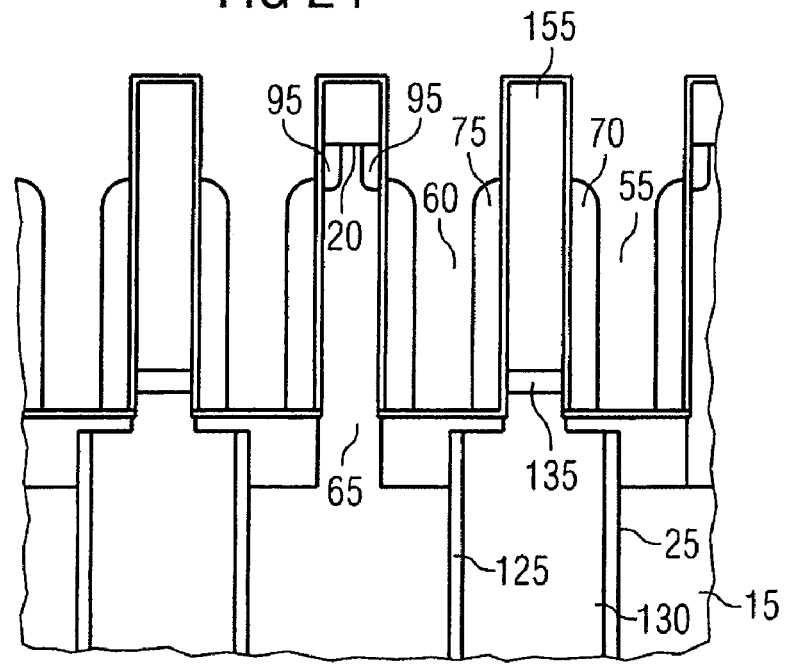
FIG. 24 is a sectional view of FIG< 23 taken along the section line XXIV—XXIV.

FIG. 24 illustrates a sectional diagram along the section line XXIV from FIG. 23. Proceeding from FIG. 22, firstly a sacrificial oxide can be formed and removed for cleaning the active region. A gate oxide can subsequently be formed at the sidewall of the active region 65. The gate oxide can be grown thermally in an oxygen-containing atmosphere, or be formed by means of a deposition process, such as a CVD process. On the gate oxide, in the first longitudinal trench 55, the first spacer word line 70 is formed for example with a thickness of 0.4 F, the first spacer word line can include, for example, polycrystalline silicon and tungsten. The first spacer word line 70 can be formed, for example, together with the second spacer word line 75 by carrying out a conformal deposition of polycrystalline silicon and tungsten and then can perform an anistropic etching-back, so that the first spacer word line 70 and the second spacer word line 75 can be formed as spacers. Afterward, for example, the drain doping region 95 can be implanted with a tilt angle of +45° and −45° with respect to the normal to the substrate and an acceleration voltage of about 5 kiloelectronvolts.

Figure 25:
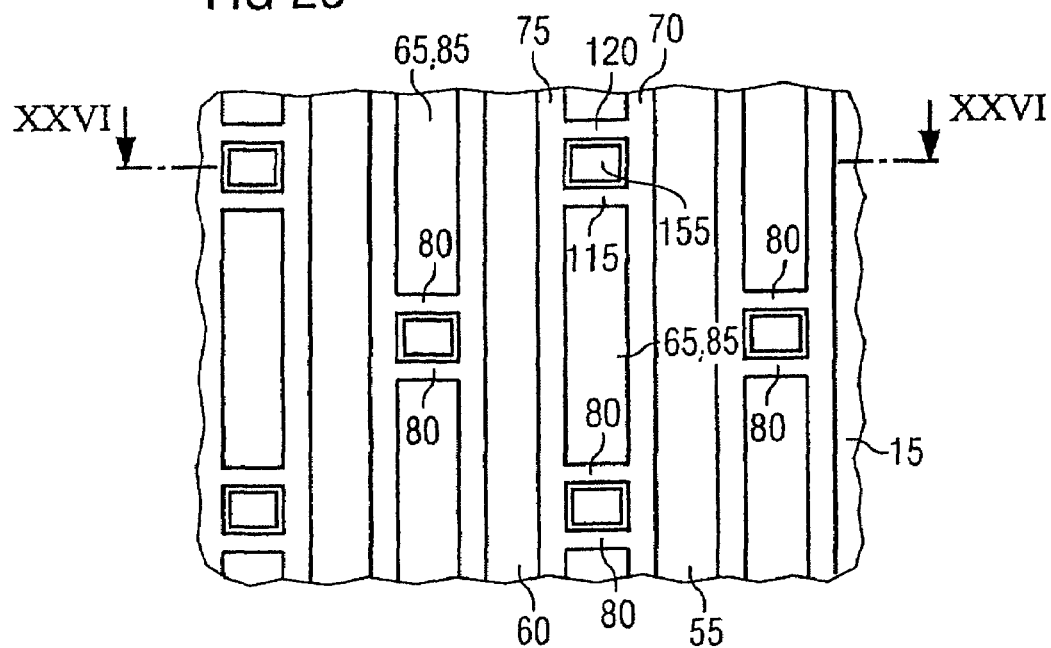
FIG. 25 illustrates a plan view according to FIG. 23.

FIG. 25 illustrates the plan view of the substrate 15 in which conductive connecting webs 80 can be formed, instead of the second insulating layer 150 between the first spacer word line 70 and the second spacer word line 75. For example, there are formed in the first trench 25 a first conductive connecting web 115 and, opposite the first filling material 155, a second conductive connecting web 120. The conductive connecting webs and the spacer word lines enclose an active region 65 and constitute gate electrodes for the selection transistor arranged in the active region 65.

Figure 26:
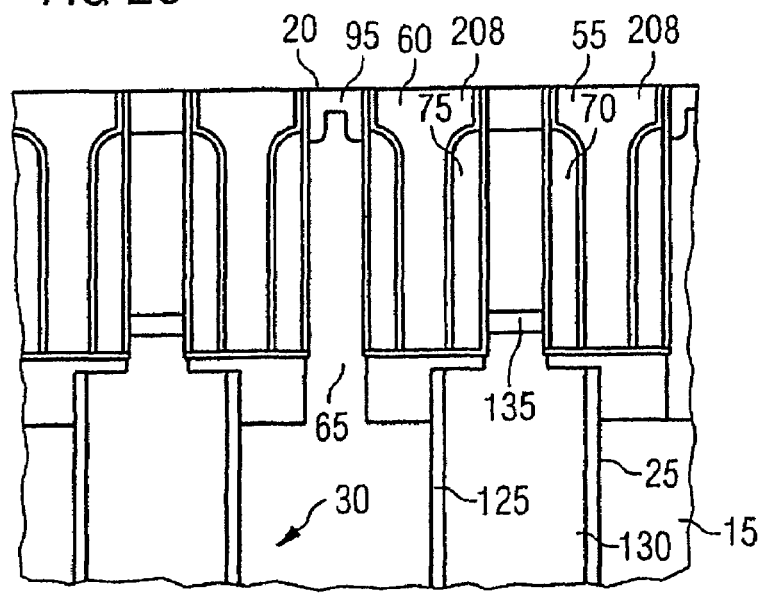
FIG. 26 is a sectional view of FIG. 25 taken along the section line XXVI—XXVI.

FIG. 26 illustrates a sectional diagram along the section line XXVI from FIG. 25. The first longitudinal trench 55 and the second longitudinal trench 60 can be filled with a third filling material 208, which may be formed from silicon oxide, for example, by an HDPCVD process (High Density Plasma).

Figure 27:
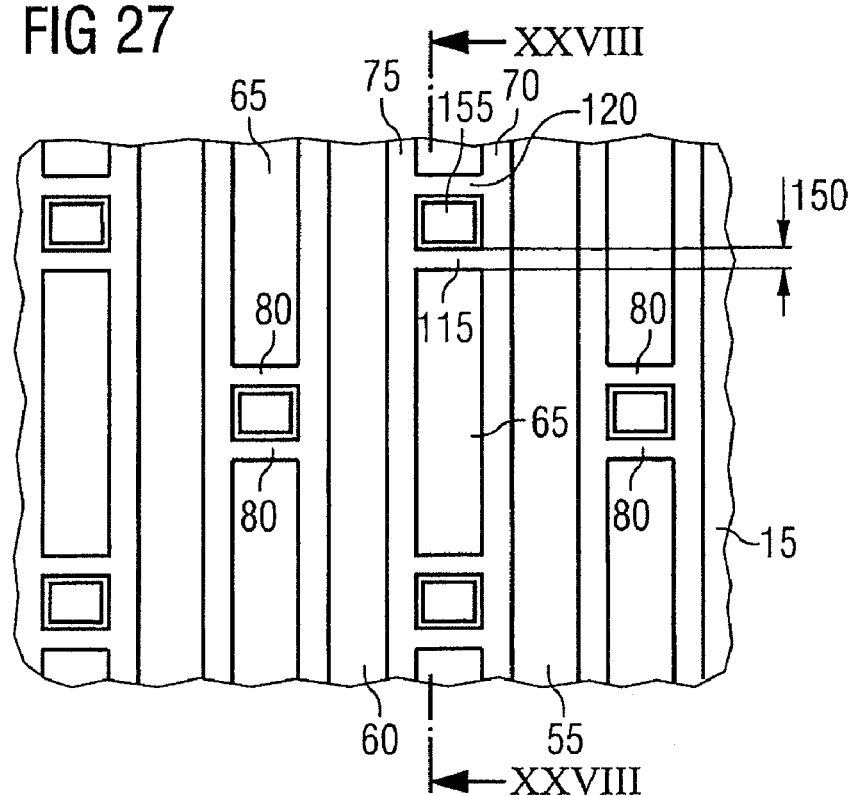
FIG. 27 illustrates a plan view according to FIG. 25.

FIG. 27 illustrates a further plan view of the substrate 15.

Figure 28:
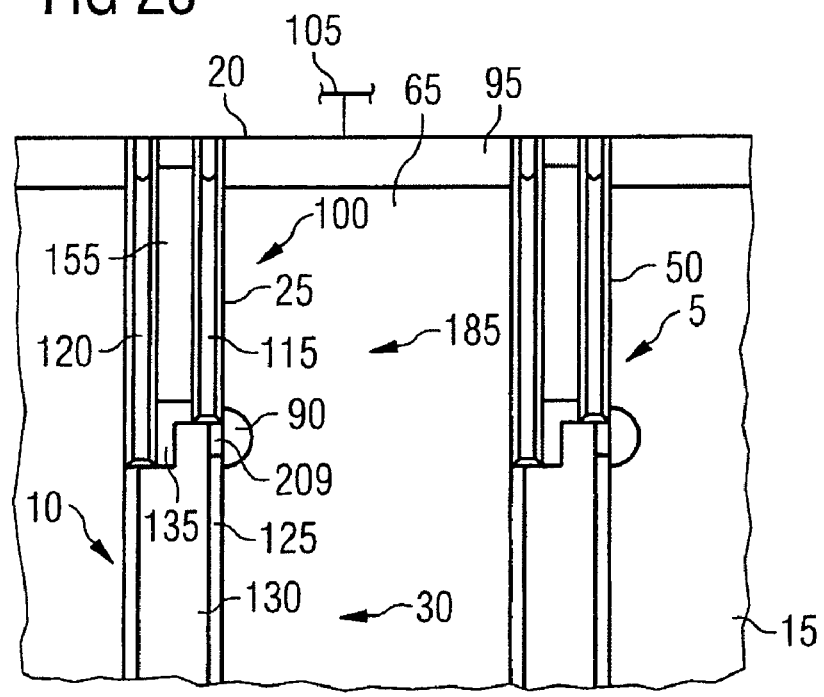
FIG. 28 is a sectional view of FIG. 27 taken along the section line XXVIII—XXVIII.

With reference to FIG. 28, the illustration shows a sectional diagram along the section line XXVIII from FIG. 27. The first connecting web 115 and the second connecting web 120 can be arranged in the trench 25. A channel 100 of the vertical selection transistor 85 can be arranged at the sidewall of the trench 25. The source doping region 90 can be arranged beside the buried strap 209 in the substrate 15. The drain doping region 95 can be arranged at the substrate surface 20 and connected to a bit line 105. The semiconductor memory cell 10 can include comprises the trench capacitor 30 and the vertical selection transistor 85. The semiconductor memory cell 10 together with adjacent semiconductor memory cells can form a semiconductor memory 5.

The second connecting web 120 can be formed deeper into the substrate 15, so that the conductivity of the second connecting web 120 can form a shielding from adjacent active regions 65 and thus from adjacent semiconductor memory cells in an improved manner.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

We claim:

1. A semiconductor memory with semiconductor memory cells, comprising:
   a substrate, the substrate having a substrate surface;
   a first trench, the first trench being arranged in the substrate and having a lower region, a central region and an upper region, the first trench having a trench capacitor formed therein;
   a first direction and a second direction, the second direction crossing the first direction;
   a second trench, the second trench being arranged beside the first trench with respect to the first direction in the substrate, the second trench having a trench capacitor formed therein;
   a first longitudinal trench and a second longitudinal trench, the first and second longitudinal trenches being relatively arranged parallel to one another and extend along the first direction, the first longitudinal trench adjoining the first trench and the second trench, the second longitudinal trench adjoining the first trench and the second trench on the opposite side of the first trench and the second trench with respect to the first longitudinal trench;
   an active region, the active region being arranged between the first longitudinal trench, the second longitudinal trench, the first trench and the second trench;
   a first spacer word line, the first spacer word line being arranged in the first longitudinal trench laterally at the active region;
   a second spacer word line, the second spacer word line being arranged in the second longitudinal trench laterally at the active region;
   conductive connecting webs, the webs being arranged in the upper region of the first trench or of the second trench as connections between the first spacer word line and the second spacer word line; and
   a vertical selection transistor, which has a source doping region, a drain doping region and a channel, the channel being arranged between the source doping region and the drain doping region in the active region and the source doping region being connected to the trench capacitor and the drain doping region being connected to a bit line, the bit line being arranged on the substrate and crossing the first spacer word line wherein the thickness of the connecting webs in the direction of the first spacer word line is less than half the width of the first trench in the direction of the first spacer word line.

2. The semiconductor memory according to claim 1, wherein a first connecting web and a second connecting web are arranged in the first trench, the first connecting web adjoining the active region and the second connecting web being arranged at a sidewall of the first trench opposite to the first connecting web in the upper region of the first trench.

3. The semiconductor memory according to claim 1, wherein the active region is enclosed by gate electrodes formed by the spacer word line and the connecting web.

4. The semiconductor memory according to claim 2, wherein a connecting web is, in each case, arranged between two active regions.

5. The semiconductor memory according to claim 2, wherein the second connecting web, proceeding from the substrate surface, extends relatively more deeply into the first trench than the first connecting web.

6. The semiconductor memory according to claim 1, wherein an insulation collar is arranged on the side wall of the trench in the central region of the trench.

7. The semiconductor memory according to claim 1, wherein a conductive trench filling is arranged as an inner capacitor electrode of the trench capacitor in the lower region and the central region of the trench.

8. The semiconductor memory according to claim 7, wherein an insulating layer is arranged on the conductive trench filling, the insulating layer extending from the first connecting web to the second connecting web, the insulating layer having an angled course at the second connecting web so that the insulating layer covers the second connecting web along a relatively longer distance than the first connecting web.

9. The semiconductor memory according to claim 1, wherein the insulation collar, along the periphery of the first trench, has a relatively uniform distance from the substrate surface.

10. The semiconductor memory according to claim 3, wherein a connecting web is, in each case, arranged between two active regions.

* * * * *